United States Patent
Shin et al.

(10) Patent No.: US 11,167,656 B2
(45) Date of Patent: Nov. 9, 2021

(54) CHARGING SYSTEM CAPABLE OF REDUCING LEAKAGE CURRENT

(71) Applicants: Hyundai Motor Company, Seoul (KR); Kia Motors Corporation, Seoul (KR)

(72) Inventors: Ho Joon Shin, Whasung-Si (KR); Nam Koo Han, Whasung-Si (KR); Sang Yoo Lee, Whasung-Si (KR); Heon Young Kwak, Whasung-Si (KR); Hong Geuk Park, Whasung-Si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 192 days.

(21) Appl. No.: 16/420,599

(22) Filed: May 23, 2019

(65) Prior Publication Data
US 2020/0180461 A1 Jun. 11, 2020

(30) Foreign Application Priority Data
Dec. 6, 2018 (KR) .................. 10-2018-0156087

(51) Int. Cl.
| | |
|---|---|
| H02J 7/00 | (2006.01) |
| H02J 7/14 | (2006.01) |
| B60L 53/60 | (2019.01) |
| H02J 7/04 | (2006.01) |
| B60L 53/20 | (2019.01) |
| G01R 31/50 | (2020.01) |

(52) U.S. Cl.
CPC .............. *B60L 53/60* (2019.02); *B60L 53/20* (2019.02); *G01R 31/50* (2020.01); *H02J 7/04* (2013.01); *B60Y 2200/91* (2013.01); *B60Y 2200/92* (2013.01); *B60Y 2300/91* (2013.01)

(58) Field of Classification Search
USPC ........................................ 324/509; 320/104
See application file for complete search history.

(56) References Cited

U.S. PATENT DOCUMENTS

| | | | |
|---|---|---|---|
| 2011/0204849 A1* | 8/2011 | Mukai ..................... | B60L 53/62 320/111 |
| 2019/0379229 A1* | 12/2019 | Woo ........................ | H02M 1/08 |

FOREIGN PATENT DOCUMENTS

| | | | | |
|---|---|---|---|---|
| JP | 2009240016 A | * | 10/2009 | ............ B60L 3/0069 |
| KR | 10-1795080 B1 | | 11/2017 | |

* cited by examiner

*Primary Examiner* — Samuel Berhanu
(74) *Attorney, Agent, or Firm* — Morgan, Lewis & Bockius LLP

(57) ABSTRACT

A charging system configured for reducing a leakage current may include an on board charger (OBC) receiving an alternating current (AC) power supplied from an external source to charge a vehicle battery with the AC power; at least an electric component connected to an output end portion of the OBC; at least a switch selectively connecting the electric component to or from a ground; and a controller connected to the at least a switch and reducing the leakage current flowing to the ground by controlling the switch connected to the electric component depending on whether or not the vehicle battery is charged with the AC power.

14 Claims, 10 Drawing Sheets

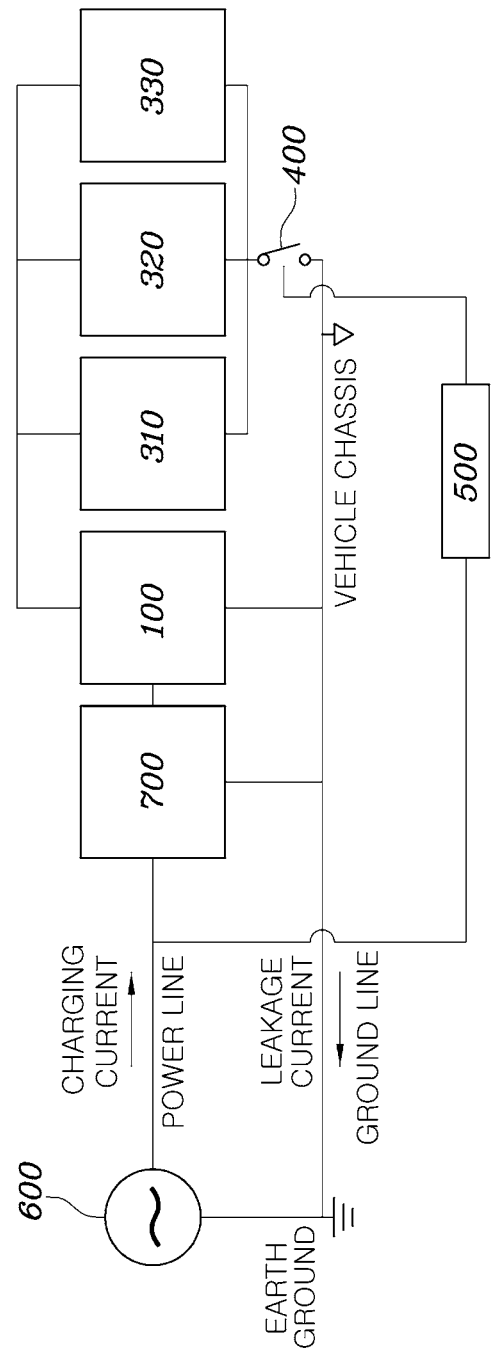

CHARGING SYSTEM CAPABLE OF REDUCING LEAKAGE CURRENT

CROSS REFERENCE TO RELATED APPLICATION

The present application claims priority to Korean Patent Application No. 10-2018-0156087, filed on Dec. 6, 2018 the entire contents of which is incorporated herein for all purposes by this reference.

BACKGROUND OF THE INVENTION

Field of the Invention

The present invention relates to a charging system configured for reducing a leakage current, and more particularly, to a charging device configured for reducing the leakage current by disconnecting Y-capacitors from a ground when a vehicle battery is being charged with a power in an on board charger (OBC) system of a non-insulation type.

Description of Related Art

In general, an electric vehicle or a plug-in hybrid vehicle may include an energy storage device (for example, a battery) receiving and storing an alternating current (AC) system power using a charging facility. The vehicle may include a charging device converting the AC system power provided from an external charging facility into a direct current (DC) power of desired magnitude to charge the energy storage device.

A charging device disposed in a vehicle is generally referred to as an on board charger OBC, and may include: a power factor correction converter generating a DC voltage by correcting the power factor of an input AC power; and a DC-DC converter converting an output voltage of the power factor correction converter into a voltage of a magnitude required for charging a battery. Y-capacitors may also be provided at input and output ends of the OBC to remove a noise component.

Meanwhile, the AC power provided by the charging facility outside the vehicle may be symmetric or asymmetric depending on a charging facility type or a power supply network type in each country. When the AC power is asymmetric, a common mode component may exist. This common mode component may act as a low-frequency (system power frequency) noise, so that there may be generated a leakage current flowing to a ground through the Y-capacitors.

When the DC-DC converter included in the OBC is an insulation type converter including a transformer, input and output ends of the DC-DC converter are isolated from each other, and therefore, the common mode component of the system power may have no effect on the output end of the OBC. When the DC-DC converter is a non-insulation type converter, however, an electrical connection path is formed between the input and output ends of the DC-DC converter, and therefore, the common mode component of the system power may flow out to be a low-frequency a leakage current through the Y-capacitors connected to the output end of the OBC.

Meanwhile, the external charging facility may include a residual current detection (RCD) device. A charging operation may be stopped when the leakage current is generated exceeding a reference detection level (about 30 mArms) set by the RCD, and a problem such as a safety accident may also occur when a user touches a ground line in the meantime.

The information disclosed in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to providing a charging system configured for reducing a leakage current in which the leakage current flowing to a ground may be reduced by controlling a switch selectively connecting electric component to or from a ground depending on whether or not a vehicle battery is charged with a power.

According to an exemplary embodiment of the present invention, a charging system configured for reducing a leakage current may include: an on board charger (OBC) receiving an alternating current (AC) power supplied from an external source to charge a vehicle battery with the AC power; at least an electric component connected to an output end of the OBC; at least a switch selectively connecting the electric component to or from a ground; and a controller connected to the at least a switch and reducing the leakage current flowing to the ground by controlling the switch connected to the electric component depending on whether or not the vehicle battery is charged with the AC power.

The charging system configured for reducing a leakage current may further include first and second Y-capacitors between positive (+) and negative (−) terminals of an input end of the electric component and the ground, respectively.

The switch may be positioned between a node between the first and second Y-capacitors and the ground, and connect or disconnect the first and second Y-capacitors to or from the ground.

The controller may disconnect the first and second Y-capacitors from the ground by opening the switch when the vehicle battery is being charged with the AC power.

The switch may be positioned between at least a of a plurality of electric components and the ground, when the plurality of electric components are connected to the output end of the OBC, respectively.

The charging system configured for reducing a leakage current may further include Y-capacitors between the positive (+) and negative (−) terminals of the input ends of a plurality of electric components and the ground, respectively, when the plurality of electric components are connected to the output end of OBC, respectively.

The switch may be positioned between the node between the Y-capacitors and the ground, and connect or disconnect the Y-capacitors to or from the ground.

The controller may disconnect the Y-capacitors from the ground by opening the switch when the vehicle battery is being charged with the AC power.

The charging system configured for reducing a leakage current may further include a power supplier supplying the AC power.

The charging system configured for reducing a leakage current may further include a filter positioned between the power supplier and the OBC, and filtering a common mode component included in the AC power provided from the power supplier.

The OBC, the electric component and the filter may be each connected to the ground.

The charging system configured for reducing a leakage current may further include third and fourth Y-capacitors connected between positive (+) and negative (−) terminals of the output end of the OBC, respectively.

The first and second Y-capacitors, and the third and fourth Y-capacitors may be respectively connected to each other in parallel.

The Y-capacitors connected between the positive (+) and negative (−) terminals of the input ends of a plurality of electric components and the ground, respectively, may be connected to the third and fourth Y-capacitors in parallel when the plurality of electric components are connected to the output end of the OBC.

The OBC may be a non-insulation type OBC.

The methods and apparatuses of the present invention have other features and advantages which will be apparent from or are set forth in more detail in the accompanying drawings, which are incorporated herein, and the following Detailed Description, which together serve to explain certain principles of the present invention.

BRIEF DESCRIPTION OF THE DRAWINGS

FIG. 9 to FIG. 10 are diagrams illustrating that three switches are used in a charging system configured for reducing a leakage current according to yet another exemplary embodiment of the present invention.

Figure 1:
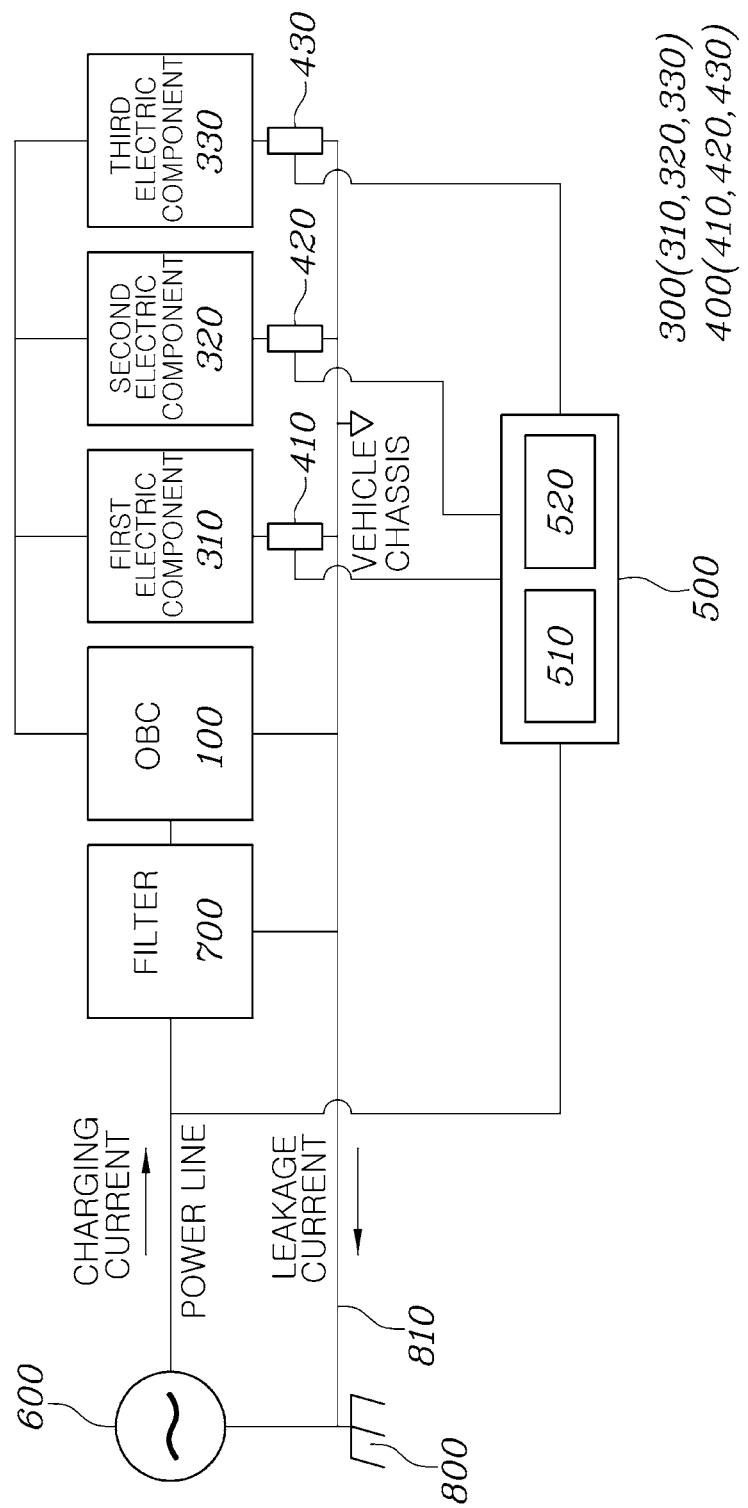
FIG. 1 is a view exemplarily illustrating a constitution of a charging system configured for reducing a leakage current according to an exemplary embodiment of the present invention.

It may be understood that the appended drawings are not necessarily to scale, presenting a somewhat simplified representation of various features illustrative of the basic principles of the present invention. The specific design features of the present invention as included herein, including, for example, specific dimensions, orientations, locations, and shapes will be determined in part by the particularly intended application and use environment.

In the figures, reference numbers refer to the same or equivalent portions of the present invention throughout the several figures of the drawing.

DETAILED DESCRIPTION

Reference will now be made in detail to various embodiments of the present invention(s), examples of which are illustrated in the accompanying drawings and described below. While the present invention(s) will be described in conjunction with exemplary embodiments of the present invention, it will be understood that the present description is not intended to limit the present invention(s) to those exemplary embodiments. On the other hand, the present invention(s) is/are intended to cover not only the exemplary embodiments of the present invention, but also various alternatives, modifications, equivalents and other embodiments, which may be included within the spirit and scope of the present invention as defined by the appended claims.

Hereinafter, a charging system configured for reducing a leakage current according to exemplary embodiments of the present invention is described with reference to the accompanying drawings.

A basic principle in the present invention is described first before explaining a detailed constitution of the charging system configured for reducing the leakage current according to an exemplary embodiment of the present invention. In a non-insulation type OBC system as in the present invention, a leakage current may be generated between a system of a power supplier and a vehicle due to removal of a transformer in charge of electrical insulation. Here, the leakage current may refer to current flowing to a ground line 810 connecting a vehicle chassis to a charging facility and a system (earth) ground. Here, a magnitude of the leakage current may be determined by an equivalent voltage and an equivalent impedance (leakage current=equivalent voltage/equivalent impedance) in a leakage equivalent circuit. Here, the equivalent voltage may be determined by a pulse width modulation (PWM) switching, a system voltage and a battery voltage of the OBC, and the equivalent impedance may be determined by a leakage impedance value of the OBC and a plurality of electric components connected to the vehicle chassis. Here, the leakage impedance affecting the equivalent impedance may be determined by sizes of Y-capacitors included in the OBC and each electric component. Accordingly, to reduce the leakage current, the equivalent voltage may be needed to be decreased or the equivalent impedance may be needed to be increased. In this regard, various aspects of the present invention provide a method of reducing the leakage current by increasing the equivalent impedance. Such a reduction in the leakage current by increasing the equivalent impedance is described in detail below with reference to the drawings.

Figure 2:
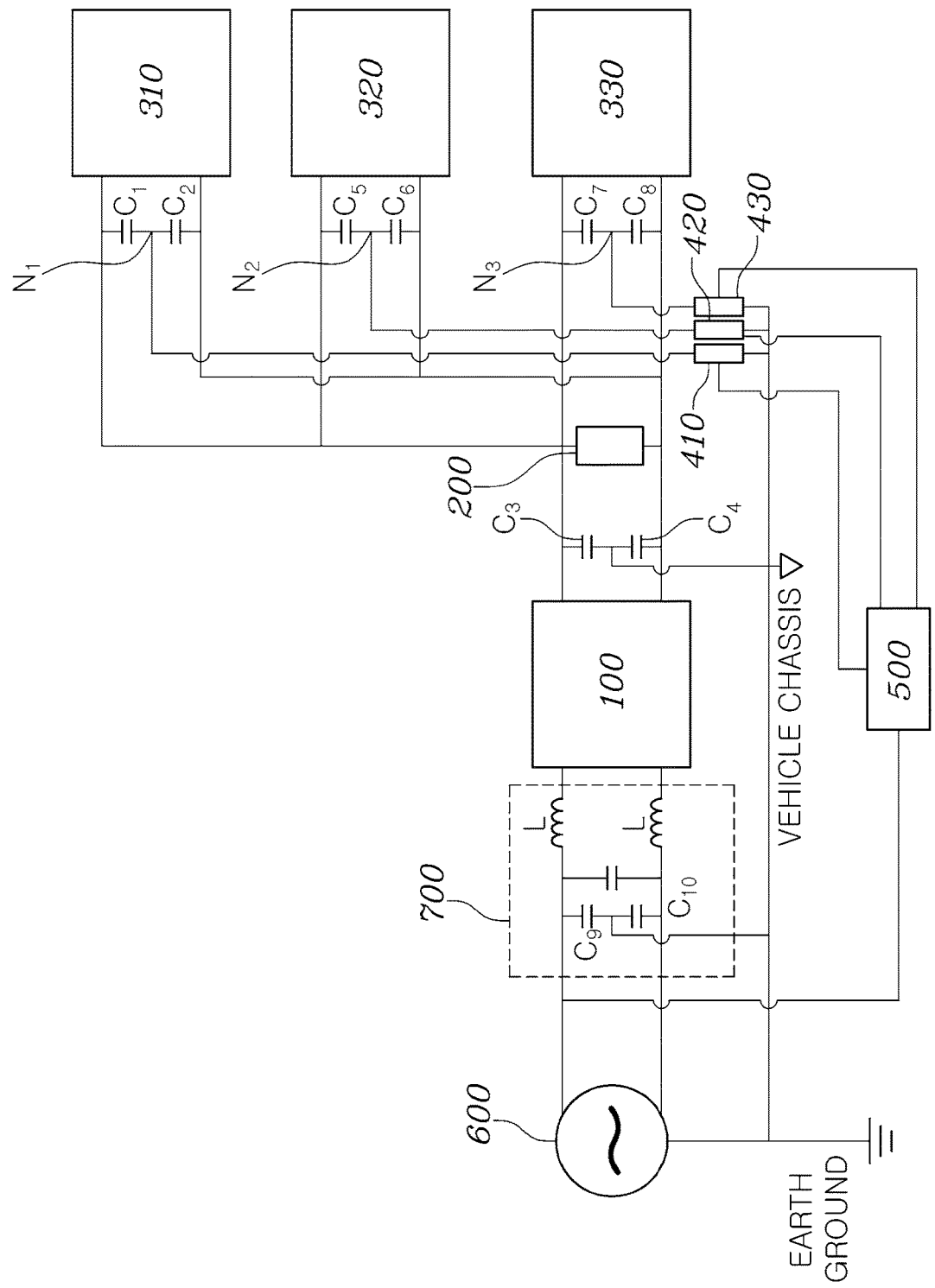
FIG. 2 is a detailed circuit diagram of a charging system configured for reducing a leakage current according to an exemplary embodiment of the present invention.

FIG. 1 is a view exemplarily illustrating a constitution of a charging system configured for reducing a leakage current according to an exemplary embodiment of the present invention; and FIG. 2 is a detailed circuit diagram of the charging system configured for reducing a leakage current. Referring to FIG. 1 and FIG. 2, the charging system configured for reducing the leakage current according to an exemplary embodiment of the present invention may include an on board charger (OBC) 100, a vehicle battery 200, an electric component 300, a switch 400, and a controller 500. The charging system may further include a power supplier 600, a filter 700, and a plurality of Y capacitors C1, C2, C3 . . . and Cn.

To be specific, the OBC 100 may be a non-insulation type OBC. The OBC 100 may receive an alternating current (AC) power from the power supplier 600 charging the vehicle battery 200, and convert the AC power into a direct current (DC) power and then output the DC power. The OBC 100 may correct a power factor of the AC power, convert the converted DC power to a DC voltage of a desired magnitude and then output the voltage. Although not specifically illustrated in the drawings, the OBC 100 may include a power factor correction (PFC), a DC-DC converter, and third and fourth Y-capacitors C3 and C4 connected between positive (+) and negative (−) terminals of an output end of the OBC 100 and a ground 800. Here, the third and fourth Y-capacitors C3 and C4 connected to the output end portion of the OBC 100 is configured to reduce noise such as electromagnetic interference (EMI) or electromagnetic compatibility (EMC) in the OBC 100.

The electric component 300 may be any one of various electric components disposed in the vehicle connected and coupled to the output end of the OBC 100, and may be coupled to the output end of the OBC 100 as shown in FIG. 2. In the present invention, at least an electric component 300 may be connected to the output end of the OBC 100. The electric component 300 may also include a battery management system (BMS), a micro controller (MCU), a positive temperature coefficient (PTC) heater, and an air conditioner (A/C). However, the above is an exemplary embodiment of the present invention, and other various electric components disposed in the vehicle may be used as the electric components in the present invention.

The switch 400 may connect or disconnect the electric component 300 to or from the ground 800. The electric component 300 may be connected to the ground 800 when the switch 400 connected to the electric component 300 is closed by the controller 500 to be described below, and the electric component 300 may be disconnected from the ground 800 when the switch 400 is opened.

The controller 500 is configured to reduce the leakage current flowing to the ground by controlling the switch 400 connected to the electric component 300 depending on whether or not the vehicle battery 200 is charged with a power. To be specific, the controller 500 may include a vehicle battery charging state sensor 510 detecting whether or not the vehicle battery 200 is charged with the power and a switch controller 520 controlling the switch 400.

The controller 500 may detect whether or not the vehicle battery 200 is charged with the power based on the above-described constitution. According to an exemplary embodiment of the present invention, the controller 500 may detect whether or not the vehicle battery 200 is charged with the power by detecting a charging current input from the power supplier 600. The controller 500 may also reduce the leakage current flowing to the ground 800 by controlling the switch 400 connected to the electric component 300 depending on whether or not the vehicle battery 200 is charged with the AC power. Referring to FIG. 1, when the battery 200 is being charged, the controller 500 may remove the Y-capacitors respectively included in the corresponding electric components 310, 320 and 330 from a leakage path by opening switches 410, 420 and 430 connected to electric components 310, 320 and 330, and accordingly, increase the equivalent impedance, and as a result, suppress the leakage current flowing to the ground. The controller 500 may be a micro control unit (MCU) or a hybrid control unit (HCU) for vehicle.

The power supplier 600 is configured to supply the AC power required for charging the vehicle battery 200. According to an exemplary embodiment of the present invention, the power supplier 600 may be a charging facility of a vehicle battery charging station.

The filter 700 may be positioned between the power supplier 600 and the OBC 100 and are configured to filter a common mode component included in the AC power supplied from the power supplier 600. According to an exemplary embodiment of the present invention, the filter 700 may be a common mode (CM) filter and may include a plurality of Y-capacitors C9 and C10.

Meanwhile, in the present invention, all of the OBC 100, the electric component 300, and the filter 700 are connected to the ground 800, respectively.

To be specific, first and second Y-capacitors C1 and C2 may be connected between the positive (+) and negative (−) terminals of the input end of the electric component 310 and the ground 800, respectively. Furthermore, when the first and second Y-capacitors C1 and C2 are connected between the positive (+) and negative (−) terminals of the input end of the electric component 310 and the ground 800, the switch 410 may be positioned between a node N1 between the first and second Y-capacitors C1 and C2 and the ground 800, and connect or disconnect the first and second Y-capacitors C1 and C2 to or from the ground 800. When the vehicle battery 200 is being charged, the controller 500 may disconnect the first and second Y-capacitors C1 and C2 from the ground 800 by opening the switch 410.

As shown in FIGS. 1 to 10, Y-Capacitors C1, C2, C5, C6, C7 and C8 may be connected between the positive (+) and negative (−) terminals of the input ends of a plurality of electric components 310, 320 and 330, and the ground 800, respectively, when the plurality of electric components 310, 320 and 330 are connected to the output end of the OBC according to an exemplary embodiment of the present invention. As above, the switches 410, 420 and 430 may be positioned between one or more of the plurality of electric components 310, 320 and 330, and the ground 800, respectively, when the Y-Capacitors C1, C2, C5, C6, C7 and C8 are connected between the positive (+) and negative (−) terminals of the input ends of the plurality of electric components 310, 320 and 330, and the ground 800, respectively.

Meanwhile, the switches 410, 420 and 430 may be positioned between nodes N1, N2 and N3 between the Y-capacitors C1, C2, C5, C6, C7 and C8, and the ground 800, respectively, and connect or disconnect the Y-capacitors C1, C2, C5, C6, C7 and C8 to or from the ground 800, respectively. For example, the controller 500 may disconnect the Y-capacitors C1, C2, C5, C6, C7 and C8 from the ground 800, respectively, by opening the switches 410, 420 and 430, when the vehicle battery 200 is being charged. When the vehicle battery 200 is being charged, the controller 500 may remove the Y-capacitors respectively included in the corresponding electric components 310, 320 and 330 from the leakage path by opening the switches 410, 420 and 430 connected to the electric components 310, 320 and 330, and accordingly, increase the equivalent impedance, and as a result, suppress the leakage current flowing to the ground.

Meanwhile, when a single electric component 300 is connected to the output end of the OBC 100, the third and fourth Y-capacitors C3 and C4 connected to the output end of the OBC 100 may be connected to the first and second Y-capacitors C1 and C2 connected to the input end of the electric component 300 in parallel, respectively. When a plurality of electric components are connected to the output end of the OBC 100, the Y-capacitors C1, C2, C5, C6, C7 and C8 positioned between the positive (+) and negative (−) terminals of input ends of the plurality of electric components 310, 320 and 330, and the ground, respectively, may be connected to the third and fourth Y-capacitors C3 and C4 connected to the output end of the OBC 100 in parallel.

Hereinafter, referring to FIGS. 3 to 10, a connection relationship between the electric components and a switch when three electric components are connected to the output end of the OBC 100 will be described.

Figure 3:
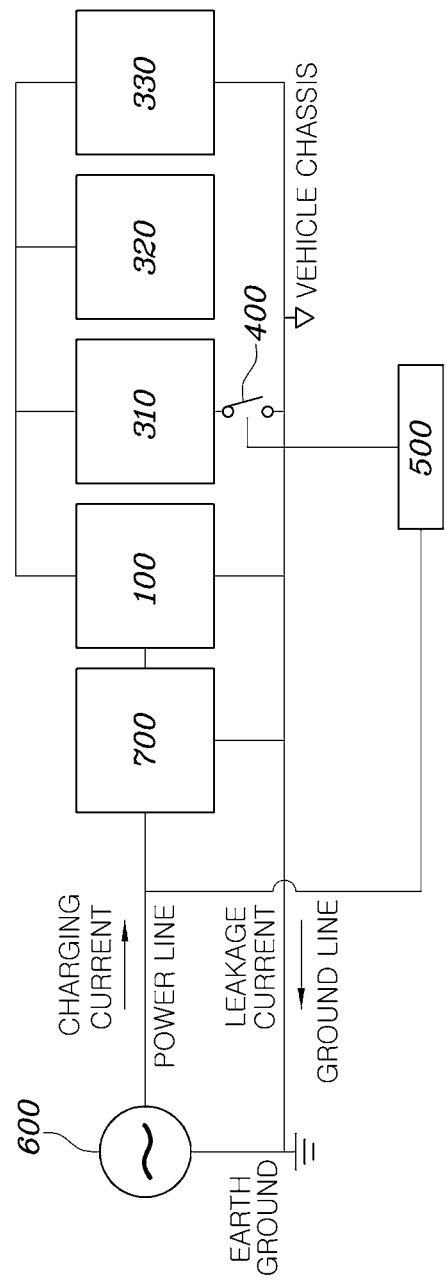
FIG. 3, FIG. 4, and FIG. 5 are diagrams illustrating that a single switch is used in a charging system configured for reducing a leakage current according to an exemplary embodiment of the present invention.
Figure 4:
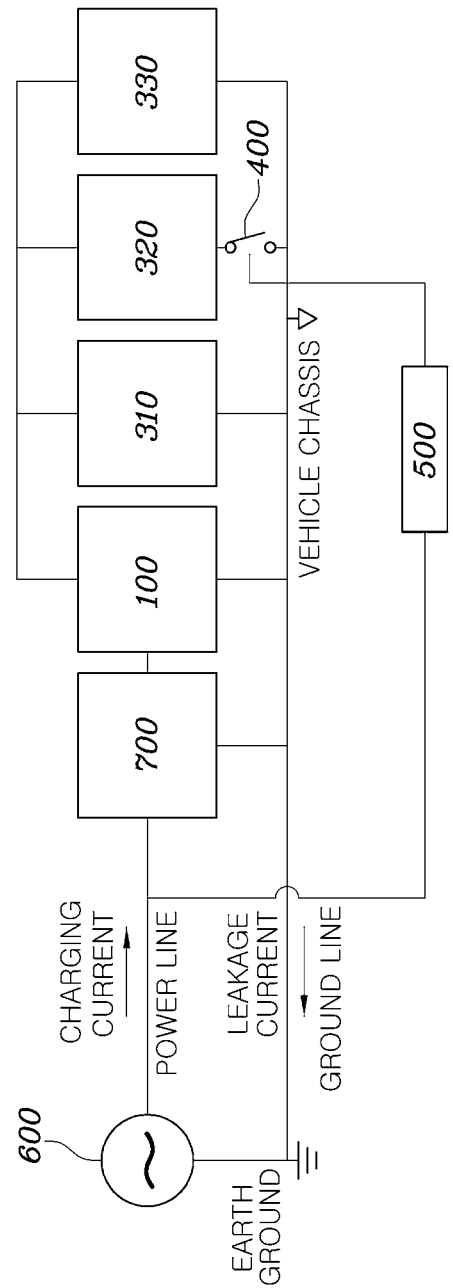
Figure 5:
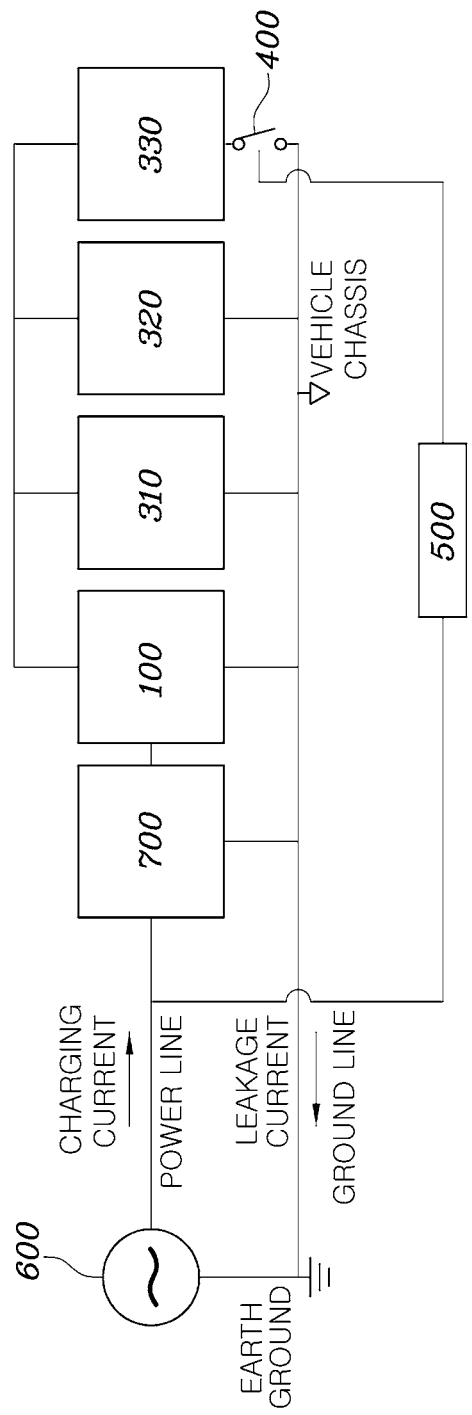
Figure 6:
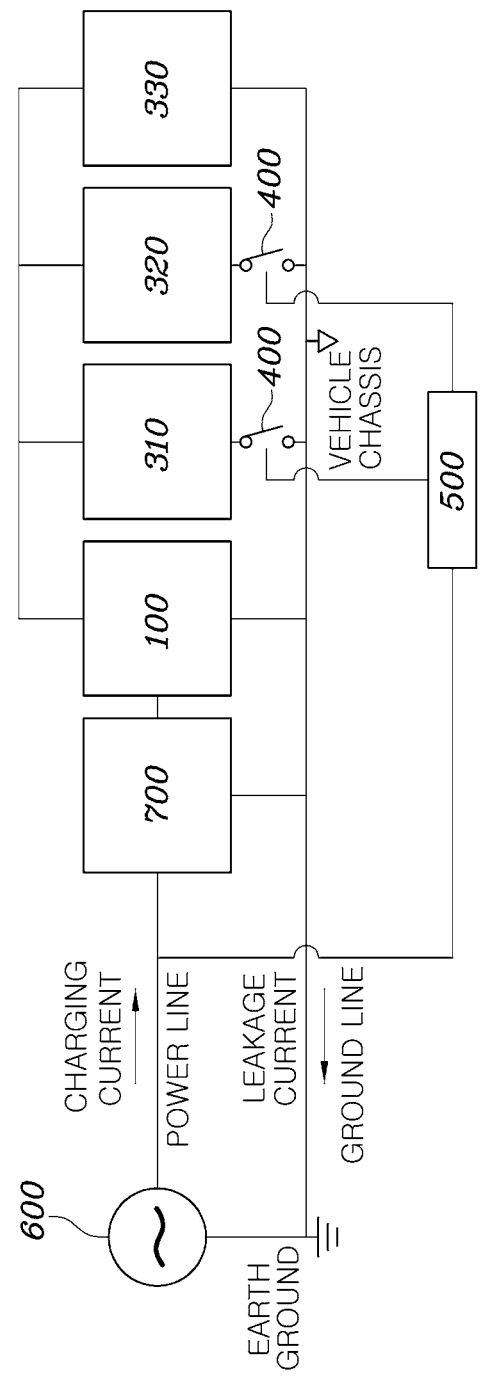
FIG. 6, FIG. 7, and FIG. 8 are diagrams illustrating that two switches are used in a charging system configured for reducing a leakage current according to various exemplary embodiments of the present invention.
Figure 7:
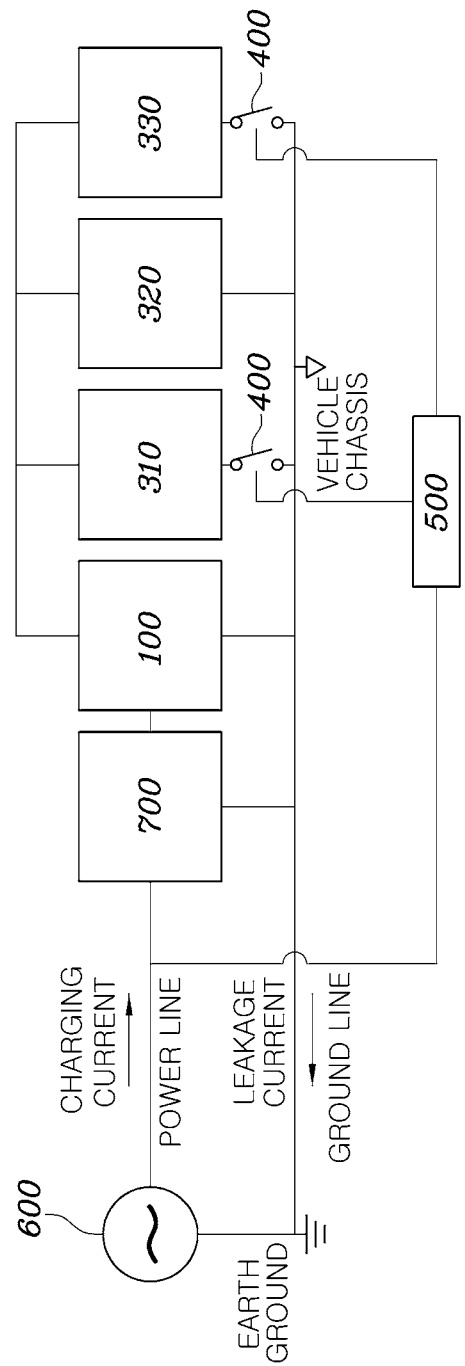
Figure 8:
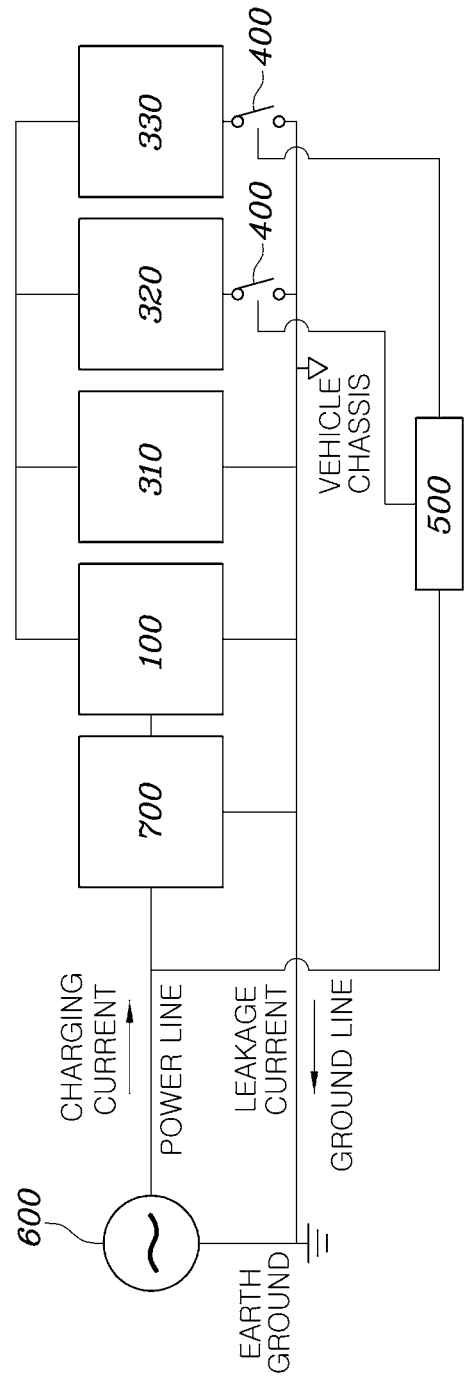
Figure 9:
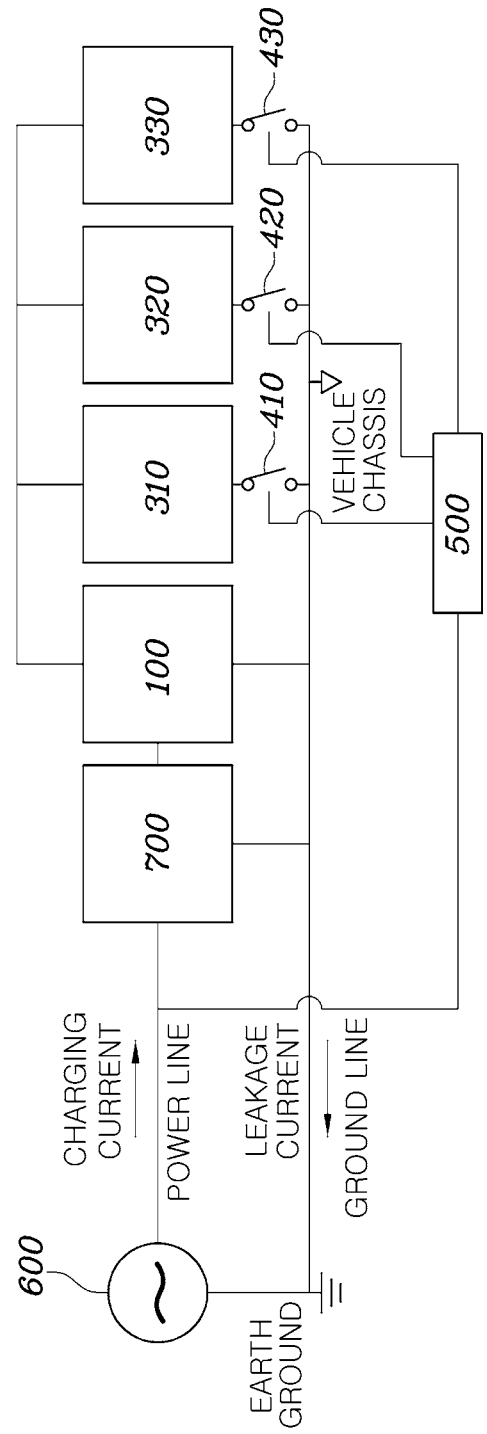

Referring to FIG. 3, FIG. 4, and FIG. 5, the switch 400 may be positioned between one of the three electric components 310, 320, and 330 and the ground 800 when the three electric components 310, 320, and 330 are connected to the output end of the OBC 100. Referring to FIGS. 6 to 8, the switches 410 and 420 may be positioned between two of the three electric components 310, 320 and 330, and the ground 800 when the three electric components 310, 320, and 330 are connected to the output end of the OBC 100. Referring to FIG. 9 and FIG. 10, the switches 410, 420 and 430 may be positioned between the three electric components 310, 320 and 330, and the ground 800 when the three electric components 310, 320, and 330 are connected to the output end of the OBC 100, or the switch 400 may be positioned between a node where the three electric components 310, 320, 330 are combined to one another, and the ground 800.

According to an exemplary embodiment of the present invention, the leakage current flowing to the ground may be reduced by controlling the switch selectively connecting the electric component to or from the ground depending on whether or not the vehicle battery is charged with the AC power.

A charging function of the charging system may also be improved by reducing the leakage current.

For convenience in explanation and accurate definition in the appended claims, the terms "upper", "lower", "inner", "outer", "up", "down", "upper", "lower", "upwards", "downwards", "front", "rear", "back", "inside", "outside", "inwardly", "outwardly", "internal", "external", "inner", "outer", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present invention have been presented for purposes of illustration and description. They are not intended to be exhaustive or to limit the present invention to the precise forms disclosed, and obviously many modifications and variations are possible in light of the above teachings. The exemplary embodiments were chosen and described to explain certain principles of the present invention and their practical application, to enable others skilled in the art to make and utilize various exemplary embodiments of the present invention, as well as various alternatives and modifications thereof. It is intended that the scope of the present invention be defined by the Claims appended hereto and their equivalents.

What is claimed is:

1. A charging system of reducing a leakage current, the charging system comprising:
    an on board charger (OBC) receiving an alternating current (AC) power supplied from an external source to charge a vehicle battery with the AC power;
    at least an electric component connected to an output end of the OBC in parallel with the vehicle battery;
    at least a switch selectively connecting the at least an electric component to or from a ground;
    first and second Y-capacitors connected between positive (+) and negative (−) terminals of an input end of one of the at least an electric component and the ground, respectively; and
    a controller connected to the at least a switch and reducing the leakage current flowing to the ground by controlling the at least a switch connected to the at least an electric component depending on when the vehicle battery is charged with the AC power,
    wherein the controller disconnects the first and second Y-capacitors from the ground by opening the one of the at least a switch when the vehicle battery is being charged with the AC power.

2. The charging system of claim 1,
    wherein the at least a switch is disposed between at least one of a plurality of electric components and the ground, when the plurality of electric components are connected to the output end of the OBC, respectively in parallel.

3. The charging system of claim 2, further including:
    Y-capacitors between the positive (+) and negative (−) terminals of the input ends of a plurality of electric components and the ground, respectively, when the plurality of electric components are connected to the output end of the OBC, respectively.

4. The charging system of claim 3,
    wherein the at least a switch is disposed between a node between the Y-capacitors and the ground, and selectively connects the Y-capacitors to or from the ground.

5. The charging system of claim 4,
    wherein the controller disconnects the Y-capacitors from the ground by opening the at least a switch when the vehicle battery is being charged with the AC power.

6. The charging system of claim 1, wherein the external source includes a power supplier supplying the AC power.

7. The charging system of claim 6, further including:
    a filter disposed between the power supplier and the OBC, and filtering a common mode component included in the AC power provided from the power supplier.

8. The charging system of claim 7, wherein the filter includes a plurality of Y-capacitors.

9. The charging system of claim 7,
    wherein the OBC, the at least an electric component and the filter are respectively connected to the ground.

10. The charging system of claim 1, further including:
third and fourth Y-capacitors connected between positive (+) and negative (−) terminals of the output end of the OBC, respectively.

11. The charging system of claim 10, wherein the third and fourth Y-capacitors are disposed between the output end of the OBC and the vehicle battery.

12. The charging system of claim 10,
    wherein the first and second Y-capacitors, and the third and fourth Y-capacitors are respectively connected to each other in parallel.

13. The charging system of claim 10,
    wherein remaining Y-capacitors of the at least a Y-capacitor are connected between the positive (+) and negative (−) terminals of input ends of a plurality of electric components and the ground, respectively, and
    wherein the third and fourth Y-capacitors are connected to each other in parallel when the plurality of electric components are connected to the output end of the OBC.

14. The charging system of claim 1, wherein the OBC is a non-insulation type OBC.

* * * * *